United States Patent [19]
Matsuura

[11] Patent Number: 6,131,023
[45] Date of Patent: Oct. 10, 2000

[54] CABLE MODEM TUNER WITH AN UP-STREAM AND A RECEPTION CIRCUIT IN THE SAME CASING

[75] Inventor: Syuuji Matsuura, Ikoma, Japan

[73] Assignee: Sharp Kabushiki Kaisha, Tokyo, Japan

[21] Appl. No.: 09/176,201

[22] Filed: Oct. 21, 1998

[30] Foreign Application Priority Data

Oct. 24, 1997 [JP] Japan ..................................... 9-291937

[51] Int. Cl.[7] .............................. H04B 1/10; H04H 1/00; H04N 7/10; H04N 7/14; H04N 5/50
[52] U.S. Cl. .......................... 455/301; 709/217; 348/12; 348/13; 348/731; 455/5.1; 455/189.1; 455/191.1; 455/192.3; 375/216
[58] Field of Search ................................ 348/11, 12, 13, 348/731; 455/5.1, 188.2, 189.1, 190.1, 191.1, 191.3, 180.2, 191.2, 180.4, 301; 375/216

[56] References Cited

U.S. PATENT DOCUMENTS

| | | |
|---|---|---|
| 4,245,245 | 1/1981 | Matsumoto et al. . |
| 4,442,548 | 4/1984 | Lehmann . |
| 4,726,072 | 2/1988 | Yamashita et al. . |
| 5,204,645 | 4/1993 | Hohmann . |
| 5,212,828 | 5/1993 | Hatashita et al. . |
| 5,475,876 | 12/1995 | Terada et al. ........................... 455/301 |
| 5,483,209 | 1/1996 | Takayama . |

FOREIGN PATENT DOCUMENTS

| | | |
|---|---|---|
| 03 48697A2 | 1/1990 | European Pat. Off. . |
| 04 29914A2 | 6/1991 | European Pat. Off. . |
| 04 57932A1 | 11/1991 | European Pat. Off. . |
| 06 24039A2 | 11/1994 | European Pat. Off. . |
| 0851580-A1 | 7/1998 | European Pat. Off. . |
| 19639237-A1 | 3/1997 | Germany . |
| 5-176327 | 7/1993 | Japan . |
| 9-93152 | 4/1997 | Japan . |

OTHER PUBLICATIONS

H. Hohmann et al.: "ICS For Television and Video–Recorder Tuners: TUA 2017 and SDA 3302" Siemens Components, vol. 25, No. 2, May 1990, pp. 65–69.

S.M. Liew et al.: "Single Wide Band VCO for Rx and TX"—Motorola Technical Developments, vol. 10, Mar. 1990, p. 122.

Nico Baars: "ICs and Discrete Semiconductors for TV and VCR Tuners" Electronic Components and Applications., vol. 9, No. 4, 1989, Eindhoven NL, pp. 240–252.

*Primary Examiner*—Andrew I. Faile
*Assistant Examiner*—Sam Huang

[57] ABSTRACT

A cable modem tuner includes, in the same casing, an up-stream circuit to transmit an up-stream data signal to a CATV station, and a reception circuit for receiving a down-stream signal via a HPF that removes the up-stream data signal. The reception circuit includes a select circuit that selects a signal of a desired frequency band out of one of three frequency bands, a signal processing block including three local oscillation circuits to convert a signal of a desired frequency band into an intermediate frequency signal of a desired channel using an oscillation signal of a corresponding oscillation circuit, and a down converter with a local oscillation circuit converting an applied signal into a signal for demodulating a received signal. The down converter provides a baseband signal used to demodulate a received signal by the QAM when a digital signal modulated by the QAM is received. Therefore, the cable modem tuner includes an analog received signal processing circuit and a digital received signal processing circuit in the same casing, and has a structure particularly suitable to a set top box.

9 Claims, 16 Drawing Sheets

CABLE MODEM TUNER WITH AN UP-STREAM AND A RECEPTION CIRCUIT IN THE SAME CASING

BACKGROUND OF THE INVENTION

1. Field of the Invention

The present invention relates to a tuner for a cable modem. More particularly, the present invention relates to a cable modem tuner that can input/output analog and digital signals via a CATV cable for processing.

2. Description of the Background Art

In the CATV, a coaxial cable is employed as the house drop line. The HFC (Hybrid Fiber/Coax) using an optical fiber for the trunk line is now being introduced.

The HFC is employed to provide data communication service with a broad band of several M bits per second to each domestic site. By employing the HFC, a high speed data line of the transmission rate of 30 M bits/second with a bandwidth of 6 MHz can be provided even by the 64 QAM (Quadrature Amplitude Modulation) system.

By using a cable modem for the above high speed data line, high speed data communication of 4 M bits/second to 27 M bits/second can be realized using an available channel of the CATV.

FIG. 17 is a schematic block diagram of a conventional cable modem tuner. Referring to FIG. 17, a cable modem tuner (referred to as "tuner" hereinafter) 100A is incorporated in a cable modem 117A. Tuner 100A is connected to a CATV station 118A via a CATV cable 114A, and also to a computer 116A external to cable modem 117A.

Tuner 100A includes a wideband amplifier 101, a first mixer circuit 102, a first intermediate frequency amplify input tuning circuit 103, a first intermediate frequency amplifier circuit 104, a first intermediate frequency output tuning circuit 105, a second mixer circuit 106, a first local oscillation circuit 107, a second local oscillation circuit 108, an up-stream circuit 109, a data terminal 110 connected to an external QPSK (Quadrature Phase Shift Keying) transmitter 115A, an input terminal 111, an output terminal 112, and a PLL (Phase Locked Loop) channel select circuit 113.

As to a CATV signal, the so-called up-stream signal and the so-called down-stream signal are operated at 5 MHz–42 MHz and 54 MHz–860 MHz, respectively. The up-stream signal is transmitted from input terminal 111 of tuner 100A towards CATV station 118A via cable 114A. The down-stream signal is transmitted from the end of CATV station 118A towards input terminal 111 of tuner 100A via cable 114A. The up-stream signal sent from tuner 100A is received by the data receiver of CATV station 118A (system operator) to be input to the center computer. As to the up-stream signal within cable modem 117A, a quadrature phase shift keyed data signal from, for example, QPSK transmitter 115 is applied to data terminal 110. This data signal is transmitted to CATV station 118A via data terminal 110, up-stream circuit 109, and input terminal 111.

As to the down-stream signal, the data signal received at CATV station 118A is modulated to, for example, 64 QAM and delivered on cable line 114A to cable modem 117A via input terminal 111. In cable modem 117, a desired signal is channel-tuned by tuner 100A with respect to the input data signal. Then, the signal obtained by channel-tuning is demodulated to 64 QAM by a circuit not shown in cable modem 117A. The demodulated signal is subjected to MPEG reproduction and then processed by a CPU (microcomputer) not shown. The processed signal is applied to TV monitor 116A.

The process of a down-stream signal within tuner 100A is set forth in the following. The down-stream signal input via input terminal 111 passes through wideband amplifier 101 and then converted into a first intermediate frequency (=950 MHz) by first mixer circuit 102 and first local oscillation circuit 107. Channel-tuning is carried out for the down-stream signal by PLL-controlling first local oscillation circuit 107 with a microcomputer not shown of PPL channel select circuit 113. The first IF signal (IF is the abbreviation of intermediate frequency) obtained by converting the down-stream signal into the first intermediate frequency is tuned by first intermediate frequency input tuning circuit 103 and then amplified by first intermediate frequency amplifier circuit 104. The amplified signal is channel-tuned by second intermediate frequency output tuning circuit 105 and then output to second mixer circuit 106. The IF signal having the first intermediate frequency is converted into a second IF signal by second local oscillation circuit 108 connected to second mixer circuit 106. In general, 44 MHz is used for the second intermediate frequency. The second IF signal obtained by conversion is output from output terminal 112. Here, second local oscillation circuit 108 is PLL-controlled by PLL channel select circuit 113, similar to first local oscillation circuit 107. The second IF signal output external of tuner 100A from output terminal 112 is converted into a baseband signal of 5 MHz by a circuit not shown in cable modem 117A. This signal is further A/D converted and demodulated according 60 QAM. The demodulated signal is subjected to the MPEG process to be output from cable modem 117A as a data signal.

Since tuner 100A constantly attains a standby state, low power consumption is required. Also, interference between each circuit is required in the double conversion type tuner 100A of FIG. 17. For this purpose, a casing design of an electrically strictly shielded structure must be provided for tuner 100A. Furthermore, a chassis design must be provided in which each circuit is spaced apart and in which interference is reduced. This is a bottleneck in reducing the size of tuner 100A. Local spurious disturbance easily occurs caused by interference between each local oscillation circuit of tuner 100A to result in communication error. It was therefore not possible to incorporate the circuit that converts the second IF signal into a baseband signal in the same casing where tuner 100A is accommodated.

In the so-called set top box mounted as a receiver on a television set, tuners for a digital signal and an analog signal are provided for respective channel-tuning. This double provision of the same type of tuners for the set top box results in redundant circuitry, and becomes a bottleneck in reducing the size and cost of the set top box.

SUMMARY OF THE INVENTION

An object of the present invention is to provide a cable modem tuner that can incorporate in the same casing both the circuitry for an analog signal and the circuitry for a digital signal received via a CATV cable.

According to an aspect of the invention, a cable modem tuner is connected for communication with a CATV station via a cable of a broad band, and includes a casing in which are incorporated an up-stream circuit unit for sending an up-stream data signal to the CATV station through the cable, and a receiver unit receiving a down-stream signal from the CATV signal for processing while removing the up-stream signal.

The receiver unit includes a select unit, a first tuning unit, a high frequency amplify unit, a second tuning unit, a frequency converter unit, an intermediate frequency amplify unit, and a signal conversion unit.

The select unit selects and outputs a signal out of signals received via the cable, corresponding to a desired system among a plurality of systems that includes at least two systems according to a frequency band. The first tuning unit tunes the signal output from the select unit to the desired high frequency in respective plurality of systems. The high frequency amplify unit amplifies the signal output from the first tuning unit in respective plurality of systems for output. The second tuning unit tunes the signal output from the high frequency amplify unit to the desired high frequency in respective plurality of systems for output. The frequency converter unit includes a first oscillator unit to convert the signal output from the second tuning unit into a signal of a desired intermediate frequency using an oscillation signal of the first oscillator unit in respective plurality of systems. The intermediate frequency amplify unit is provided common to the plurality of systems to amplify and output the signal from the frequency converter unit. The signal conversion unit includes a second oscillator unit, and converts an applied signal into a demodulation signal to demodulate a received signal using an oscillation signal of the second oscillator unit. At the receiver unit, the signal output from the intermediate frequency amplify unit is provided outside when the received signal is an analog signal and processed at the signal conversion unit for output when the received signal is a digital signal.

In the case where the signal received through the cable is an analog signal, the desired analog intermediate frequency signal is provided outside. In the case where the signal received via the cable is a digital signal, the demodulation signal used to demodulate the digital received signal is output from the signal conversion unit. Thus, a cable modem tuner can be obtained that has the processing circuit unit for an analog signal received through the CATV cable and the processing circuit unit for a digital signal received through the CATV cable in the same casing.

When the cable modem tuner is provided at the set top box, it is no longer necessary to provide an individual tuner for an analog signal and an individual tuner for a digital signal as in the conventional set top box. Therefore, redundant circuitry is eliminated in the set top box to promote reduction in size and cost.

When the down-stream signal received by the cable modem tuner is a digital signal that is modulated according to the QAM system, the signal for demodulation is a baseband signal used in demodulating a received signal according to the QAM system. The signal conversion unit includes a down converter that converts an input signal into a baseband signal by reducing the frequency.

By using this cable modem tuner, a digital signal modulated according to the QAM system can be received, and a signal to demodulate this signal can be obtained.

The receiver unit further includes an output unit receiving a signal from the intermediate frequency amplify unit to provide the signal outside when the received signal is an analog signal, and to apply the signal to the signal conversion unit when the received signal is a digital signal.

When the received signal is an analog signal, an intermediate frequency signal of a desired channel can be provided via the output unit. When the received signal is a digital signal, a signal for demodulating the digital signal can be obtained.

The output unit includes a branching unit that receives the signal output from the intermediate frequency amplify unit to branch the signal into two directions. The branching unit is connected to the signal conversion unit in one of the two directions, and to the terminal unit to output a signal in the other direction.

When the received signal is an analog signal, an intermediate frequency signal of a desired channel can be provided outside via the terminal unit. When the received signal is a digital signal, a signal to demodulate this digital signal can be obtained from the signal conversion unit.

When a digital signal modulated according to the QPSK system is received, the signal for demodulation is an I signal and a baseband signal of a Q signal used to demodulate the received signal according to the QPSK method, and the signal conversion unit is an IQ demodulation circuit that converts the received signal into an I signal and a baseband signal of the Q signal for output.

By using this cable modem tuner, a digital signal modulated according to the QPSK system can be received through the cable, and a signal for demodulation can be obtained.

The casing is formed of a conductive material. The interior of the casing is partitioned into a plurality of compartments by a wall of a conductive material to arrange each element of the cable modem tuner. The frequency converter unit and the signal conversion unit are arranged respectively in different compartments among the plurality of compartments.

Therefore, a shield structure is employed in which the frequency converter unit and the signal conversion unit in the casing are electromagnetically shielded to prevent interference between the first and second oscillator units, i.e., a structure in which local spurious is significantly reduced is employed. Thus, a stable operation can be realized even when the frequency converter unit and the signal conversion unit are incorporated in the same casing.

The casing includes a chassis forming the side surface and two caps forming the top and bottom surfaces to shield the casing. One of the two caps is provided with a convex portion formed towards the interior of the casing, corresponding to the compartment where the signal conversion unit is arranged.

Therefore, the circuit unit in the casing is effectively electromagnetically shielded in each compartment. The compartment where the signal conversion unit is arranged has its interior spacing reduced by the convex portion of the corresponding cap to further improve the electromagnetic shielding effect. Accordingly, an operation state of high accuracy can be achieved.

According to another aspect of the invention, a cable modem tuner is connected for communication with a CATV station via a cable of a broad band, and includes a casing in which are incorporated an up-stream circuit unit for sending an up-stream data signal to the CATV station through the cable, and a receiver unit receiving a down-stream signal from the CATV signal for processing while removing the up-stream signal. The receiver unit can include a selection unit, a frequency converter unit, and a signal conversion unit. The select unit receives a signal applied via the cable to select and output a signal of a desired one of a plurality of frequency bands including at least two frequency bands. The frequency converter unit includes a first oscillator unit corresponding to each of the plurality of frequency bands to convert the signal of a desired frequency band output from the select unit into an intermediate frequency signal of a desired channel using an oscillation signal of the first oscillator unit. The signal conversion unit includes a second oscillator unit to convert an applied signal into a demodulation signal used in demodulating a received signal using an oscillation signal of the second oscillator unit for output. The signal output from the frequency converter unit is provided outside when the down-stream signal is an analog signal and to the signal conversion unit when the down-stream signal is a digital signal.

In the case where the signal received through the cable is an analog signal, a desired analog intermediate frequency signal is provided outside. In the case where the received signal is a digital signal, a demodulation signal used in demodulating the digital received signal is output from the signal conversion unit. Thus, a cable modem tuner can be obtained having the processing circuit unit for an analog signal received through the CATV cable and a processing circuit unit for a digital signal received through the CATV cable in the same casing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
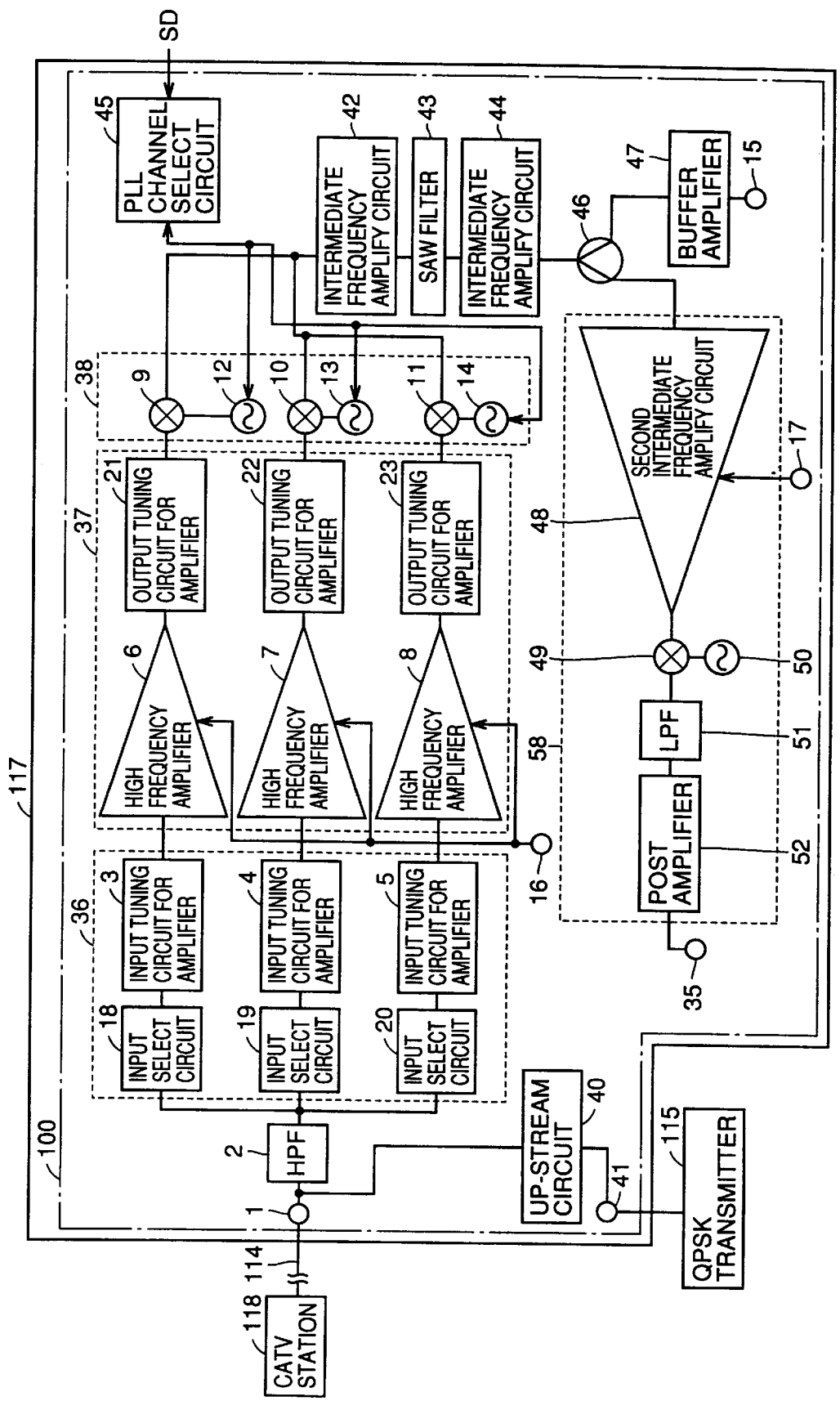
FIG. 1 is a block diagram of a cable modem tuner according to a first embodiment of the present invention.

Embodiments of the present invention will be described hereinafter with reference to the drawings.

First Embodiment

A cable modem tuner 100 incorporated in a cable modem 117 according to a first embodiment of FIG. 1 (referred to as "tuner 100" hereinafter) is suitable for use with the so-called set top box. A baseband signal for demodulation according to the QAM system can be output from tuner 100. In general, a set top box is mounted above a television set as a receiver to carry out channel tuning using an analog or digital signal received from a CATV station 118 via a CATV cable 114.

The analog IF signal or the baseband signal for demodulation according to the QAM system output from tuner 100 is transmitted to the television set. The television set receives these signals and carries out various processes such as detection of the video signal to reproduce the video and the like. The set top box is interposed between CATV station 118 and the television set for usage when a data signal is to be transmitted to CATV state 118.

Tuner 100 includes a reception circuit for the UHF band of 470–860 MHz, the VHF.HIGH (abbreviated as VHFH hereinafter) band of 170–470 MHz, and the VHF.LOW (abbreviated as VHFL hereinafter) band of 54–170 MHz, respectively. The band division is not limited to these three bands. However, the frequency band is divided into at least 2 bands.

Tuner 100 of FIG. 1 includes a CATV input terminal 1 to provide communication connection between cable 114 and tuner 100, a HPF (High Pass Filter) 2, a block 36 with an input circuit and a switch circuit for the UHF and VHF, a block 37 with a high frequency amplifier and an output tuning circuit for RF amplifier, a block 38 with a local oscillation circuit and a mixer circuit, an output terminal 15, AGC terminals 16 and 17, an output terminal 35, an up-stream circuit 40, a data terminal 41 connected to, for example, a QPSK transmitter 115 in cable modem 117, intermediate frequency amplify circuits 42 and 44, a SAW (Surface Acoustic Wave) filter 43, a PLL channel select circuit 45, a branching unit 46, a buffer amplifier 47, and a down converter 58. Down converter 58 includes a second intermediate frequency amplifier circuit 48, a mixer circuit 49, a local oscillation circuit 50, an LPF 51, and a post amplifier 52.

Blocks 37 and 38 are integrated as a 1-chip IC. Also, down converter 58 is integrated as an IC. Therefore, tuner 100 can be reduced in power consumption.

The demodulated data signal applied to data terminal 41 of tuner 100 from QPSK transmitter 115 is sent to CATV station 118 as an up-stream signal via up-stream circuit 40, CATV input terminal 1, and cable line 114. The down-stream signal applied to CATV input terminal 1 from CATV station 118 via cable 114 passes through HPF 2 to be sent to blocks 36–38. HPF 2 is a filter that has a passing band of 54 MHz and above with 5–46 MHz as the attenuation band.

Blocks 36, 37 and 38 include a reception circuit group for the UHF band, VHFH band, and VHFL band, respectively. In block 36, input select circuits 18, 19, 20 and input tuning circuits 3, 4, and 5 for high frequency amplifier are provided. In block 37, high frequency amplifiers 6, 7, and 8 having their gain controlled by the signal level of AGC terminal 16 for a high frequency signal, and output tuning circuits 21, 22 and 23 for RF amplifier are provided. In block 38 associated with PLL channel select circuit 45, mixer circuits 9, 10, 11, and local oscillation circuits 12, 13, and 14 are provided. Input select circuits 18, 19 and 20 switch the input signal by a general switching diode, or by a filter with different passing bands for the signal. In the present embodiment, the switching method by a switching diode is employed.

Any one of the reception circuit groups corresponding to respective bands attains an operating state according to the reception channel. The remaining reception circuit groups do not operate. For example, in the state of channel reception corresponding to the UHF band, the reception circuit group of the UHF band, i.e., input select circuit 18, input tuning circuit 3 for high frequency amplifier, high frequency amplifier 6, output tuning circuit 21 for RF amplifier, mixer circuit 9, and local oscillation circuit 10 are rendered operative. In contrast, the reception circuit groups of the VHF and VHFL bands, i.e., input select circuits 19 and 20, input tuning circuits 4 and 5 for high frequency amplifier, high frequency amplifiers 7 and 8, output tuning circuits 22 and 23 for RF amplifier, mixer circuits 10 and 11, and local oscillation circuits 13 and 14 cease to operate. Similarly, in the state of channel reception corresponding to the VHFH band, the reception circuit group of the VHF band, i.e., input select circuit 19, high frequency amplify input tuning circuit 4, high frequency amplifier 7, output tuning circuit 22 for RF amplifier, mixer circuit 10, and local oscillation circuit 13 are rendered operative, whereas the reception circuit groups of the UHF band and VHFL band, i.e., input select circuits 18 and 20, input tuning circuits 3 and 5 for high frequency amplifier, high frequency amplifiers 6 and 8, output tuning circuits 21 and 23 for RF amplifier, mixer circuits 9 and 11, and local oscillation circuits 12 and 14 cease to operate. Similarly, in the state of channel reception corresponding to the VHFL band, the reception circuit group of the VHFL band, i.e., input select circuit 20, high frequency amplify input tuning circuit 5, high frequency amplifier 8, output tuning circuit 23 for RF amplifier, mixer circuit 11 and local oscillation circuit 14 are rendered operative, whereas the reception circuit groups of the UHF band and VHFH band, i.e., input select circuits 18 and 19, input tuning circuits 3 and 4 for high frequency amplifier, high frequency amplifiers 6 and 7, output tuning circuits 21 and 22 for RF amplifier, mixer circuits 9 and 10, and local oscillation circuits 12 and 13 cease their operation. The circuits other than those of the reception circuit group corresponding to the abovedescribed bands are common to all the bands, and constantly operate independent of the band switching, i.e., the reception channel. The series of operations of various circuits in tuner 100 are activated according to an externally applied channel tuning data SD (not shown) to PLL channel select circuit 45. PLL channel select circuit 45 controls the oscillation frequencies of local oscillation circuits 12–14 according to channel tuning data SD corresponding to the desired channel for reception (referred to as "reception channel" hereinafter). At the same time, any of input select circuits 18, 19 and 20 corresponding to the desired band information for reception (referred to as "reception band" hereinafter) is actuated to switch the power supply to each reception circuit group.

The circuit operation corresponding to each band will be described now. The CATV signal received at input terminal 1 passes through HPF 2. The high frequency signal from HPF2 is applied to input select circuits 18, 19, and 20 for selection of the reception band. Then, the high frequency signal is guided by input tuning circuits 3, 4 and 5 for high frequency amplifier for channel selection. The signals of the channel other than those of the reception channel are attenuated. The signal of the reception channel is amplified by high frequency amplifiers 6, 7 and 8 for subsequent processing according to the AGC voltage applied through AGC terminal 16. The amplified signal is output via output tuning circuits 21, 22 and 23 for RF amplifier.

The signal of the reception channel is further applied to mixer circuits 9, 10 and 11 and local oscillation circuits 12, 13 and 14 to be converted into an IF signal. More specifically, an IF signal having a frequency corresponding to the difference between the frequency of the reception channel and the oscillation frequency of the local oscillation circuit is output and amplified by intermediate frequency amplify circuit 42. The amplified signal passes SAW filter 43 to be amplified again by intermediate frequency amplifier circuit 44.

The amplified IF signal from intermediate frequency amplify circuit 44 is sent to branching unit 46 to be branched into the two directions of buffer amplifier 47 and down converter 58 which is a digital signal conversion circuit. At buffer amplifier 47, the IF signal is amplified and provided from output terminal 15. Also, the IF signal has its frequency reduced at down converter 58 to be converted into a baseband signal to demodulate a received signal according to the QAM system.

According to the data in the memory of a microcomputer (CPU) not shown, the branch of buffer amplifier 47 is selected when the signal applied to input terminal 1 is an analog signal and to second intermediate frequency amplify circuit 48 when the signal applied to input terminal 1 is a digital signal in channel tuning.

In down converter 58, the IF signal from branching unit 46 is amplified by second intermediate frequency amplify circuit 48 according to the AGC voltage applied through AGC terminal 17. This amplified IF signal is applied to mixer circuit 49 to be mixed with the oscillation signal from local oscillation circuit 50. Local oscillation circuit 50 is a fixed oscillator circuit using a crystal oscillator to convert the IF frequency of a received signal into a low IF frequency, and provides PLL control as local oscillation circuits 12–14 that convert the received signal into an IF signal.

The second IF signal (low IF) by the difference between the oscillation signal of local oscillation circuit 50 and the IF signal or the baseband signal may be received as an image signal having a frequency two times that of the second IF signal. Therefore, this signal must be removed using LPF 51. More specifically, the signal output from mixer circuit 49 has the effect of the oscillation signal leaking from local oscillation circuit 50 removed and the removal ratio related to the image signal improved by LPF 51. The signal from LPF 51 is applied to post amplifier 52 to be amplified. The signal from post amplifier 52 is provided from output terminal 35 as a baseband signal to demodulate a received signal according to the QAM system.

In the set top box, other circuits for reception do not have to be provided by virtue of tuner 100. An analog IF signal and a baseband signal for demodulating a received signal by the QAM system can be obtained. A signal for AGC control is output to the set top box by a demodulation operation according to the QAM system. At the set top box, the signal for AGC control is provided to AGC terminals 16 and 17 of tuner 100. Accordingly, the AGC control of tuner 100 is carried out according to the operation of the demodulation operation. Also, the up-stream signal towards CATV station 118 can be transmitted from the set top box to CATV station 118 via terminal 41, up-stream circuit 40, and CATV input terminal 1 of tuner 100.

The casing in which tuner 100 of FIG. 1 is accommodated will be described hereinafter. Conventionally, down converter 58 was not incorporated in the same casing where the circuit of tuner 100 is incorporated due to the local spurious problem. However, local spurious can be reduced by employing the casing of the present invention formed of a chassis and a shield cap that will be described hereinafter. Down converter 58 and the circuits of tuner 100 can be accommodated in the same casing.

Figure 2:
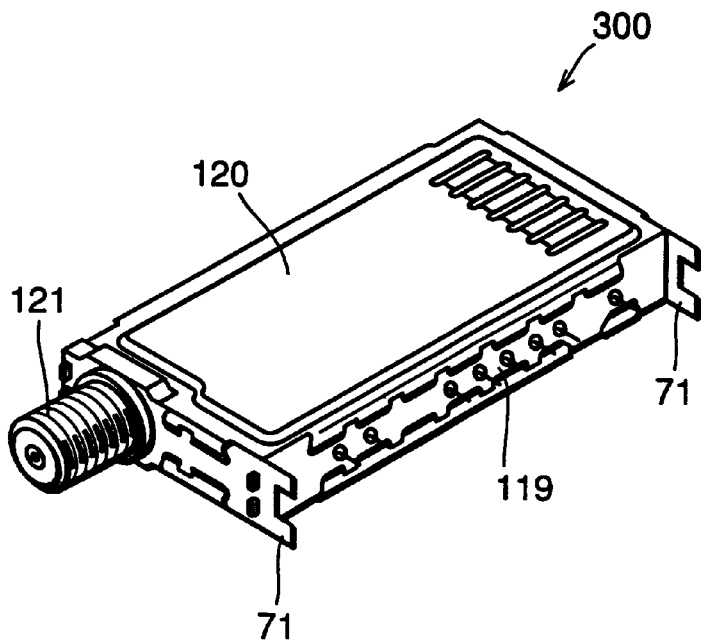
FIG. 2 shows an appearance of a casing of the cable modem tuner of the first embodiment.

An appearance of a casing 300 for accommodating tuner circuit 100 of FIG. 1 is shown in FIG. 2. Casing 300 is formed of a conductive metal plate. Casing 300 includes a chassis 119 which is a rectangular frame of two opposing long sides and two short sides, an upper shield cap 120 and a lower shield cap (not shown) attached to chassis 119 to cover the upper opening plane and lower opening plane, respectively, of chassis 119, as shown in FIG. 2. An attachment member 71 is formed integrally with chassis 119.

Figure 3:
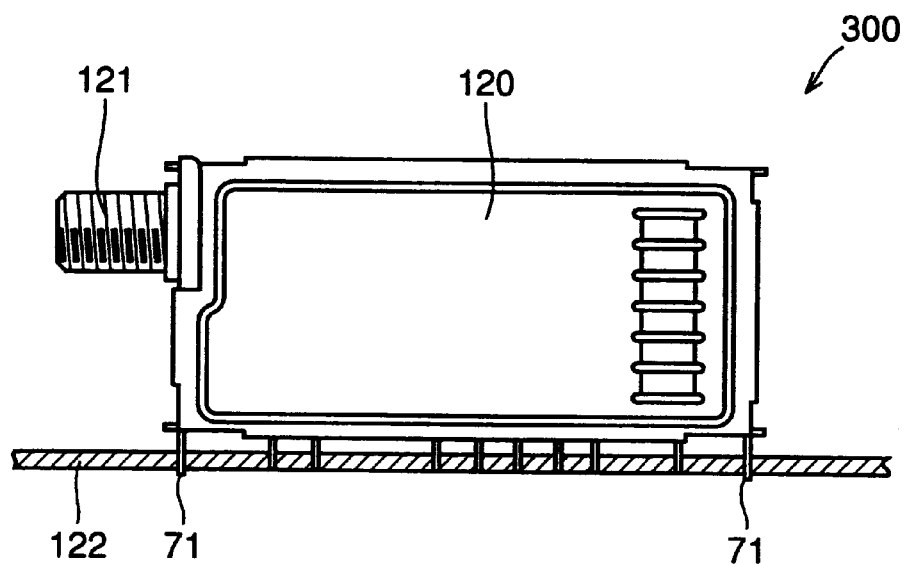
FIG. 3 shows the casing of the cable modem tuner of FIG. 2 attached to a main board of the cable modem.

Casing 300 of FIG. 2 is provided with an F terminal 121 connected to input terminal 1 of tuner 100, and functioning as an antenna of tuner 100. A main board 122 of the set top box is attached to casing 300 of FIG. 2 via a an attachment member 71, as shown in FIG. 3.

Figure 4:
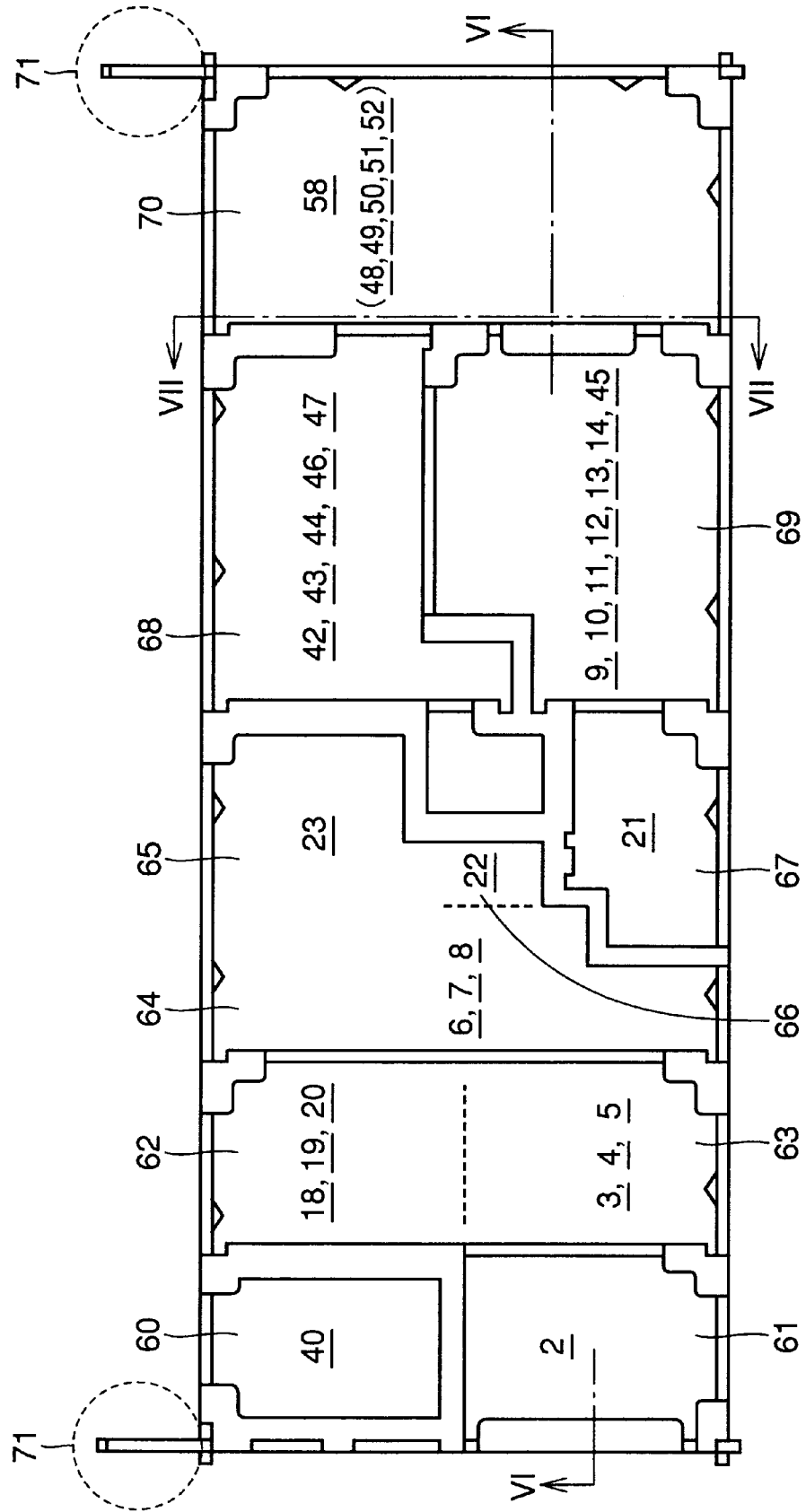
FIGS. 4 and 5 are a plan view and a longer side view of a chassis according to the first embodiment of the present invention.

The interior of chassis 119 is divided into a plurality of segments (referred to as "compartment" hereinafter) by a partition of a conductive metal plate, as shown in FIG. 4. Respective circuits of FIG. 1 are arranged in various compartments as will be described hereinafter. In FIG. 4, the reference characters of the various circuits of FIG. 1 arranged in respective compartments are underlined.

Respective circuits of tuner 100 of FIG. 1 are formed on a substrate of the tuner. This substrate is fixedly attached to the inside of chassis 119 by solder and the like to be held in the cavity in casing 300. By this attachment, various circuits of FIG. 1 are appropriately stored in respective compartments shown in FIG. 4. More specifically, up-stream circuit 40 is stored in compartment 60. HPF 2 is stored in compartment 61. In the compartment adjacent to compartments 60 and 61, input select circuits 18, 19 and 20 are stored at one corner 62 and input tuning circuits 3, 4 and 5 for high frequency amplifier are stored at another corner 63. In the compartment adjacent to compartment 67, high frequency amplifiers 6, 7 and 8 are stored at one corner 64, and output tuning circuit 22 for RF amplifier is stored at another corner 66. Also, an output tuning circuit 23 for RF amplifier is stored at another corner. For the sake of illustration, dashed lines are provided to separate corner 62 from corner 63 and to separate corner 64 from corner 66.

In compartment 65, output tuning circuit 23 for RF amplifier is stored. In compartment 67, output tuning circuit 21 for RF amplifier is stored. In compartment 68, intermediate frequency amplify circuit 42, SAW filter 43, intermediate frequency amplifier 44, branching unit 46, and buffer amplifier 47 are stored. In compartment 69, mixer circuits 9, 10 and 11, local oscillation circuits 12, 13 and 14, and PLL channel select circuit 45 are stored. In compartment 70, the respective circuits of down converter 58 are stored. Attachment member 71 of the chassis of FIG. 4 is provided as a guide in attaching the casing including the chassis to main board 122 of the set top box (refer to FIG. 3).

By separating compartments 69 and 70 with a conductive partition (metal plate) as shown in FIG. 4, local oscillation circuits 12, 13, 14 in compartment 69 and local oscillation circuit 50 in compartment 70 are electromagnetically shielded to reduce local spurious. Thus, down converter 58 and tuner 100 can be accommodated in the same casing.

Figure 5:
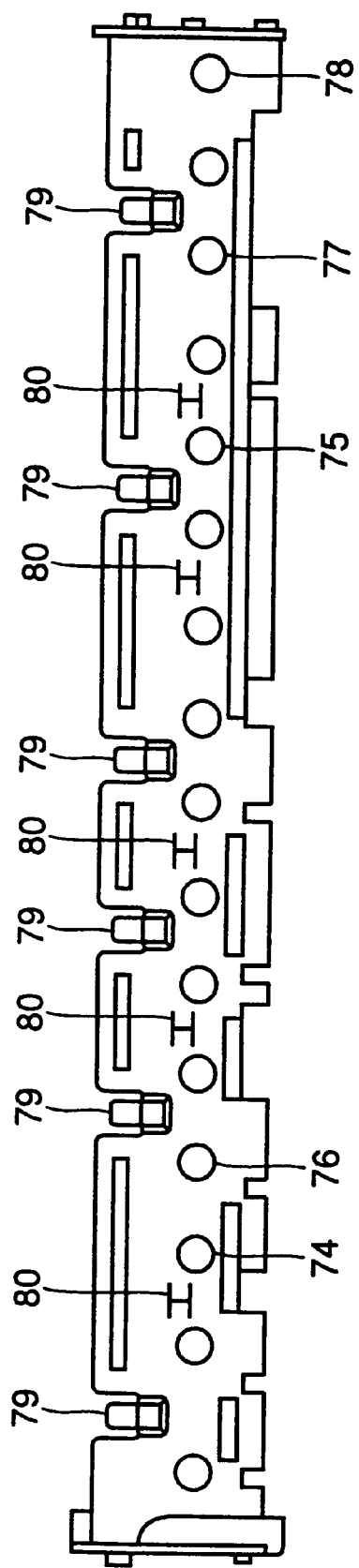

At the side surface in the longitudinal direction of the chassis of FIG. 4, a plurality of fixtures 79, a plurality of concave portions 80 and a plurality of holes for wiring including holes 74–78 are provided as shown in FIG. 5.

The plurality of fixtures 79 and concave portions 80 serve to firmly attach the substrate on which are preformed the circuits of tuner 100 of FIG. 1 within the chassis. The plurality of concave portions 80 serve to reinforce the chassis when the substrate is fixed within the chassis.

For example, data terminal 41 is provided at hole 74 to input an up-stream signal from the television set to tuner 100 via the set top box. Output terminal 15 and AGC terminals 16 and 17, and output terminals 35 are provided at holes 75, 76, 77 and 78, respectively.

Figure 6:
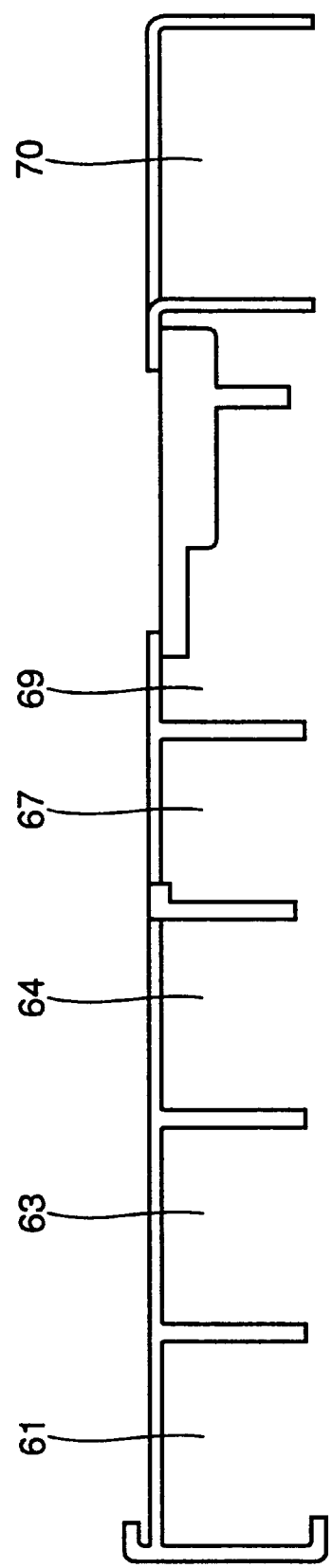
FIGS. 6 and 7 are sectional views of the chassis of FIG. 4 taken along the direction of VI—VI and the direction of VII—VII, respectively.
Figure 7:
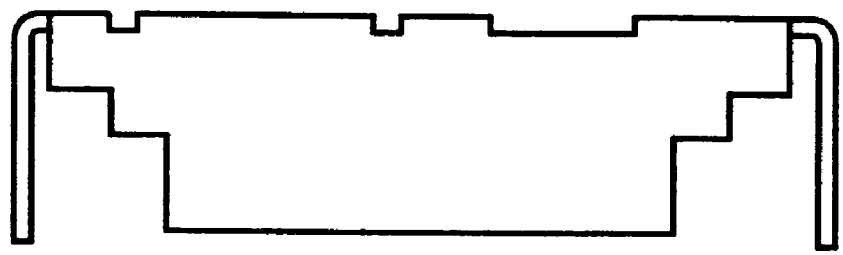

A sectional view taken along VI—VI of FIG. 4 is shown in FIG. 6. Each compartment is partitioned by a conductive metal panel as shown in FIG. 4. The compartments of FIG. 6 corresponding to the compartments of FIG. 4 have the same reference characters allotted. It is to be particularly noted that compartment 69 in which local oscillator circuits 12, 13 and 14 are stored is separated from compartment 70 in which local oscillation circuit 50 is stored. The partition wall dividing compartments 69 and 70 is shown in FIG. 7. The metal panel of FIG. 7 blocks local oscillation circuits 12, 13, 14 from local oscillation circuit 50 electromagnetically, so that local spurious is reduced without mutual interference.

Figure 8:
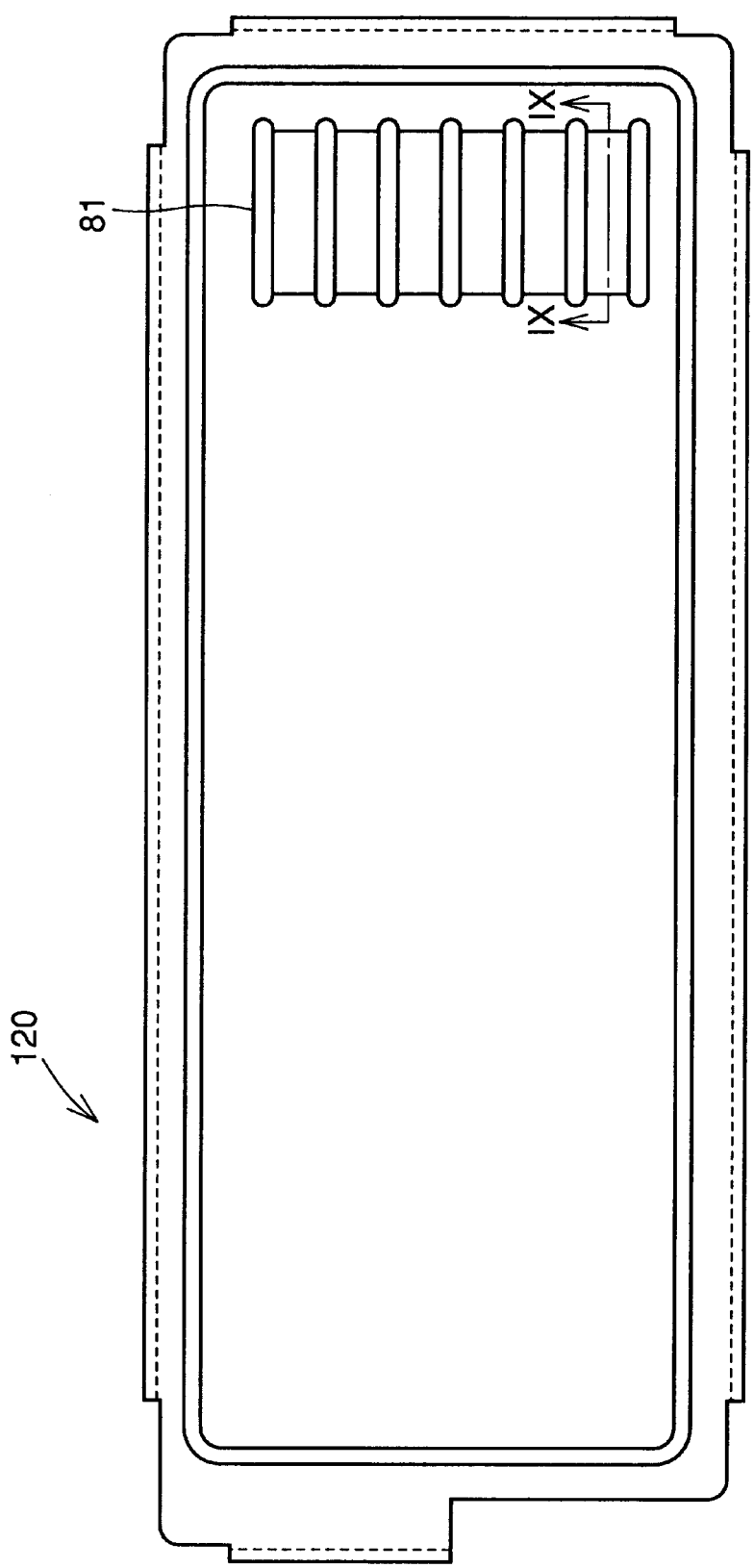
FIG. 8 is a plan view of the shield cap of FIG. 2.
Figure 9:
FIG. 9 is a sectional view of the shield cap of FIG. 2 taken along the direction of IX—IX of FIG. 8.
Figure 10:
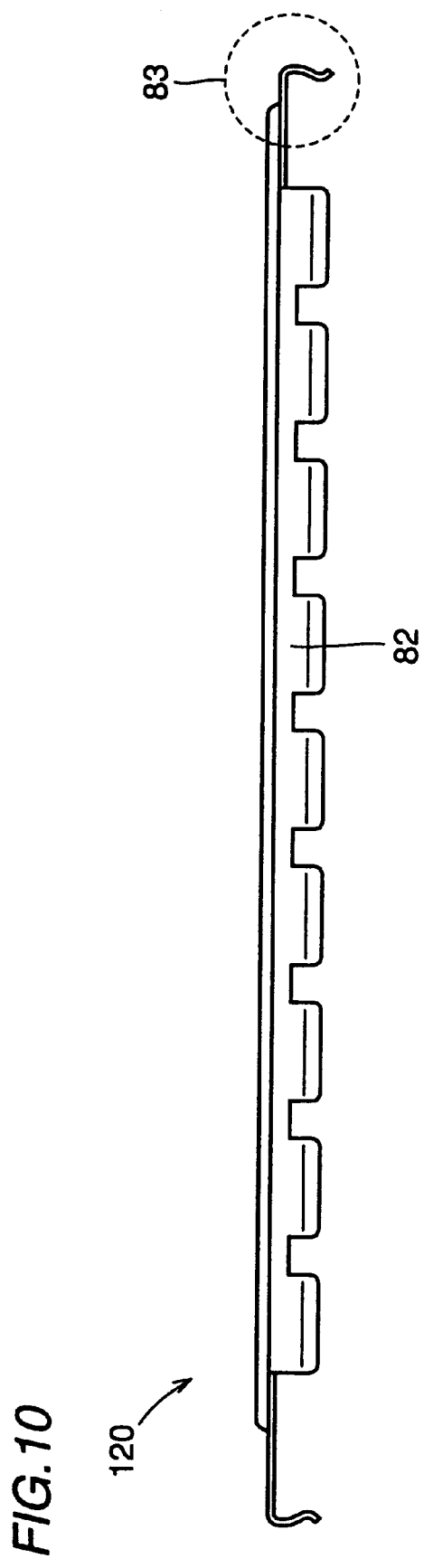
FIG. 10 is a front view of the shield cap of FIG. 2.

Referring to FIG. 8, shield cap 120 attached to chassis 119 is formed of a conductive metal panel similar to that of chassis 119. A member 81 on shield cap 120 of FIG. 8 is located relative to compartment 70. Member 81 has a leaf spring configuration protruding towards the interior of the casing as shown in FIG. 9 to reduce the spacing within compartment 70. As a result, the electromagnetic shielding effect is improved. The cross section of member 81 relative to compartment 7 is not limited to a leaf spring configuration as in the present embodiment. A similar electromagnetic blocking effect can be provided by a structure that reduces the spacing in compartment 70 such as a general convex member provided at the inner side of the casing.

A plurality of projections 82 to attach shield cap 120 to chassis 119 are formed at substantially constant intervals along the entire perimeter of shield cap 120. Projection 82 is bent in a shape 83 when viewed from the side. By attaching an upper shield cap 120 and a lower shield cap not shown to chassis 119 via such plurality of projections 82, electromagnetic sealing is provided for the internal circuit group for each compartment of FIG. 4.

Figure 11:
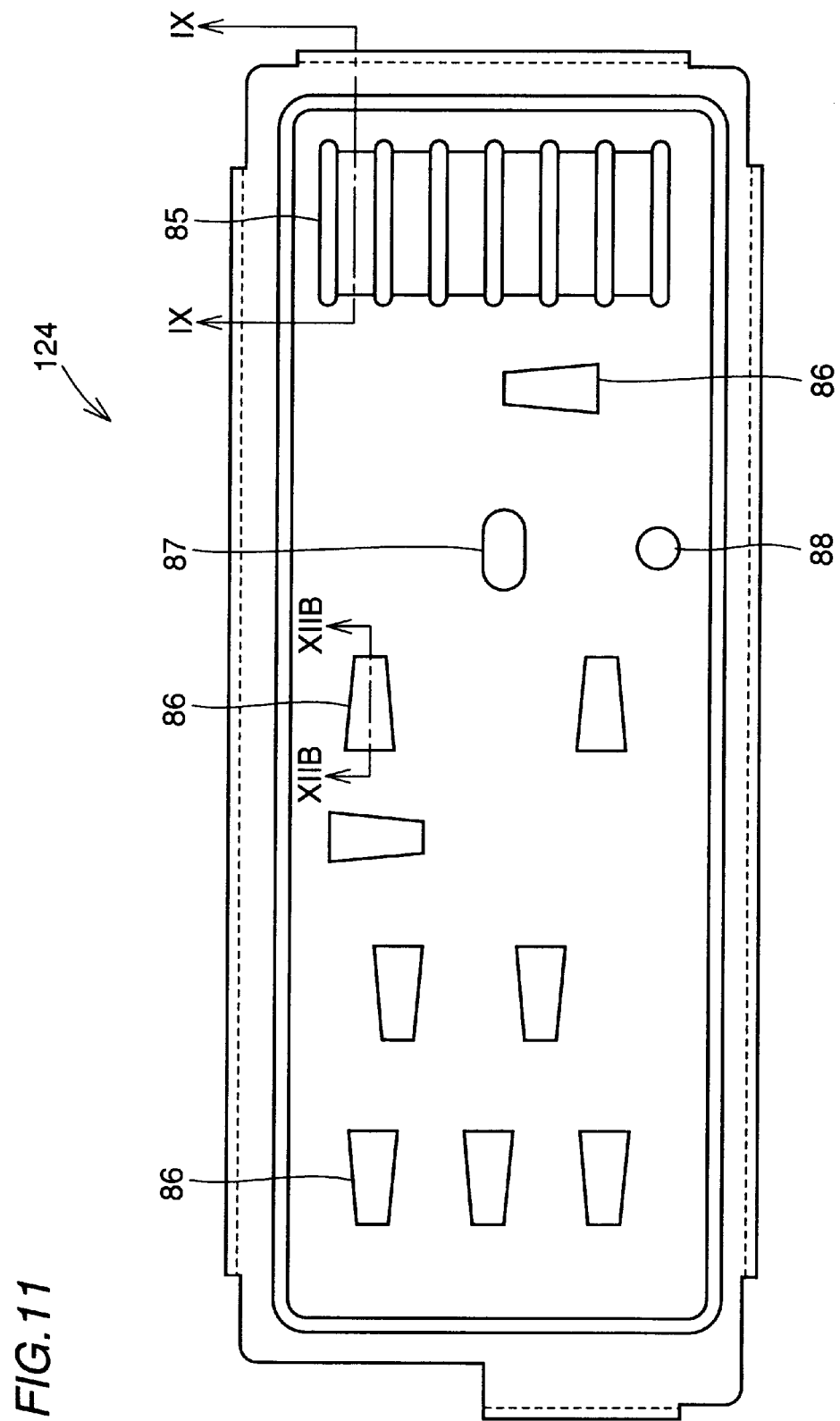
FIG. 11 is a modification of the shield cap of FIG. 8.
Figure 12A:
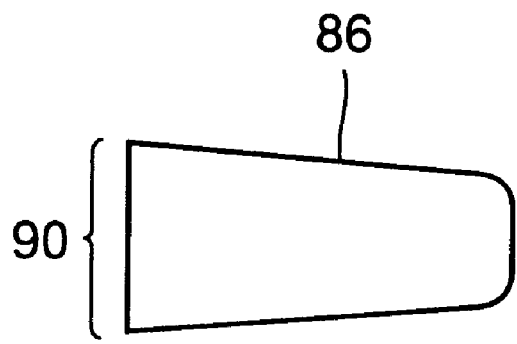
FIGS. 12A and 12B are enlarged views of the partial cut-out portion of FIG. 11.
Figure 12B:
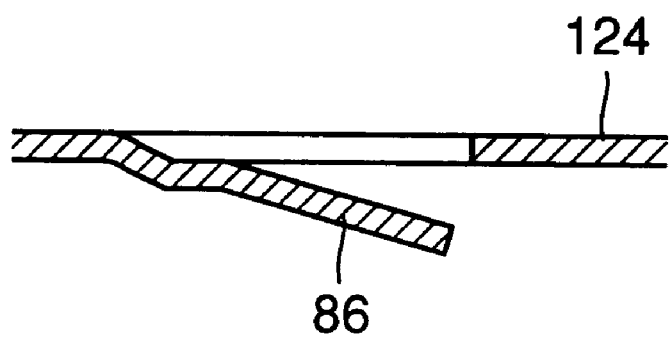

The configuration of shield cap 120 of FIG. 2 is not limited to that of FIG. 8, and may have a configuration as shown in FIG. 11. Referring to FIG. 11, a member 85 above shield cap 124 has a cross section of IX—IX in a leaf spring configuration as shown in FIG. 9. Therefore, an electromagnetic shielding effect similar to that of shield cap 120 of FIG. 8 can be obtained. A plurality of partial cut-out portions 86 are provided on shield cap 120 to further improve the electromagnetic shielding effect. The configuration of partial cut-out portion 86 direction XIIB—XIIB of FIG. 11 is shown in an enlarged manner in FIG. 12B. A portion of the surface of shield cap 124 is cut to form portion 86. The cut portion is bent inwards the casing. Each portion 86 is not completely cut out, and has a configuration in which the width is largest at the joint portion 90 with shield cap 124 and smaller towards the other end as shown in FIG. 12A.

The spacing within the casing is further reduced by provision of the plurality of partial cut-out portions 86 to further reduce local spurious. Holes 87 and 88 provided at shield cap 124 of FIG. 11 are used as holes TP (test point) for adjustment.

According to the present embodiment, the casing of tuner 100 has a structure to accommodate local spurious by dividing the interior into compartments. Thus, a tuner 100 with down converter 58 of FIG. 1 incorporated in the same casing can be obtained. The set top box can provide an analog IF signal or a baseband signal for demodulation according to the QAM system corresponding to the analog/ digital input signal from cable 114 by just the provision of tuner 100 without the need of other circuitry.

In the case where tuner 100 of the present embodiment is provided with the set top box, the signals applied to AGC terminals 16 and 17 are AGC voltage signals transmitted from the circuit for demodulation and the like according to the QAM system in circuit for cable modem. Therefore, tuner 100 of the present embodiment is particularly applicable to a set top box.

Figure 13:
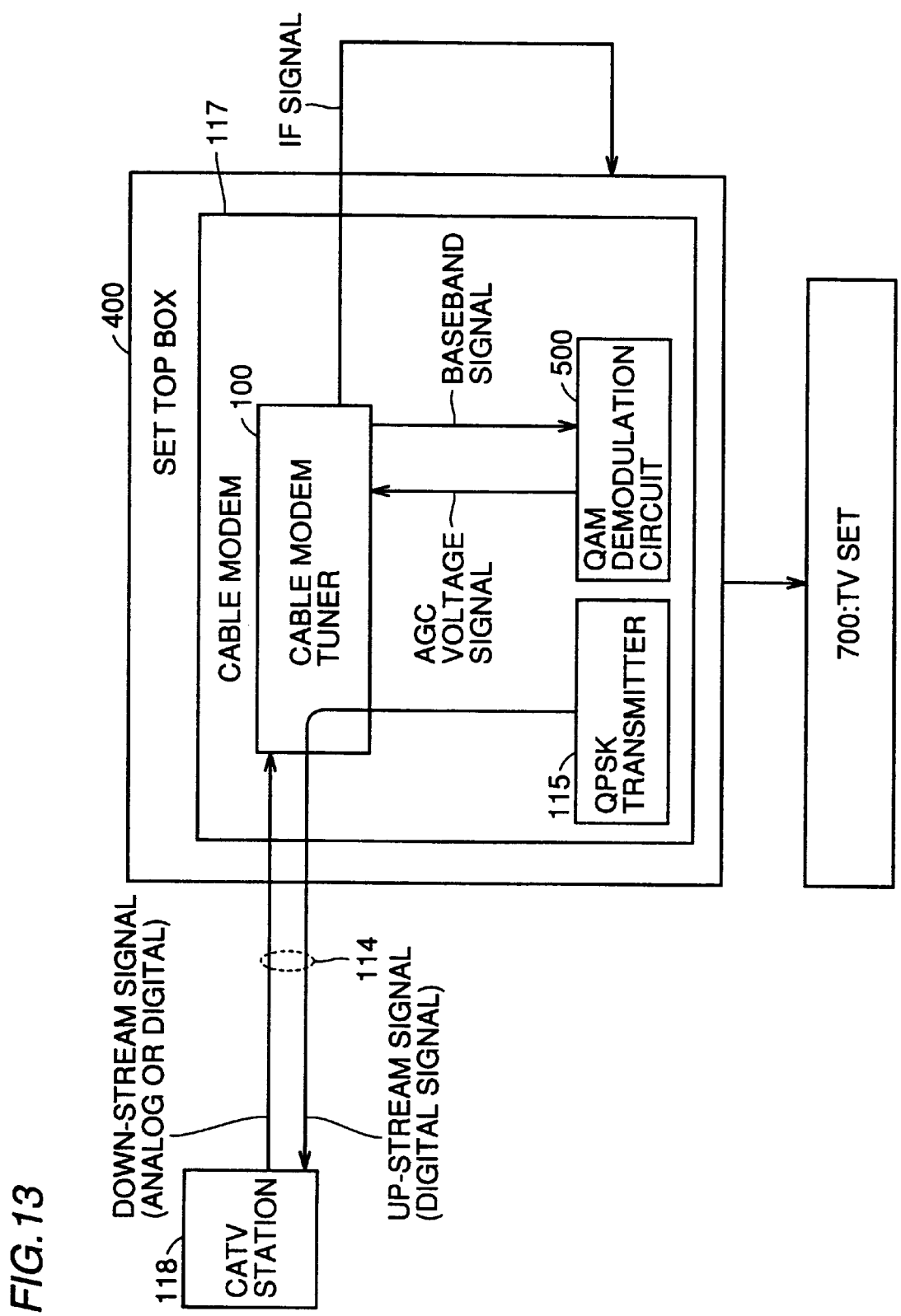
FIG. 13 shows the relationship of connection between the cable modem tuner of the first embodiment and the peripheral apparatus when the tuner is attached to a set up box.

In FIG. 13, a cable modem 117 including a QPSK transmitter 115 and a QAM demodulation circuit 500, and a cable modem tuner 100 is provided within a set top box 400 that is connected to a TV set 700.

An up-stream digital signal from QPSK transmitter 115 is transmitted to CATV station 118 via set top box 400, tuner 100, and cable 114.

The down-stream signal transmitted from CATV station 118 is received by tuner 100 to be applied to set top box 400 as an IF signal in the case of an analog signal, whereby video or audio is output in TV set 700. When the received signal is a digital signal, the signal is applied to QAM demodulation circuit 500 as a baseband signal to demodulate a received signal. The signal is subjected to a demodulation process in QAM demodulation circuit 500 to be output as a digital signal. At this stage, the aforementioned AGC voltage signal from QAM demodulation circuit 500 is applied to tuner 100.

Second Embodiment

Figure 14:
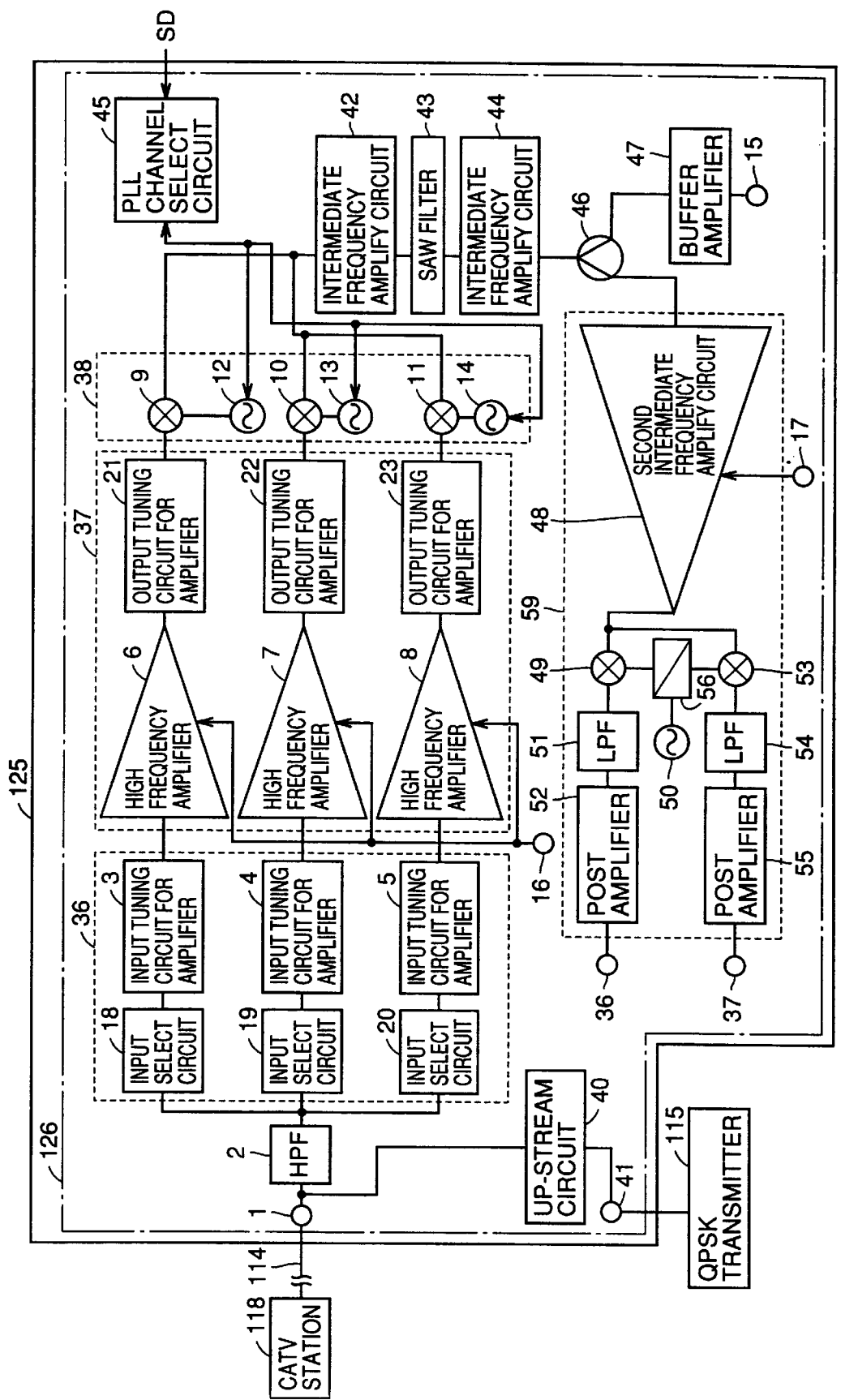
FIG. 14 is a block diagram of a cable modem tuner according to a second embodiment of the present invention.

Tuner 100 of the previous first embodiment includes a down converter 58 that carries out demodulation according to the QAM system, functioning as a conversion circuit corresponding to the case where a digital signal modulated according to QAM system is received. In contrast, a cable modem tuner 126 incorporated in cable modem 125 of FIG. 14 of the second embodiment (generically referred to as "tuner" hereinafter) 126 includes an IQ demodulation circuit 59 as a digital signal conversion circuit instead of down converter 58, and output terminals 36 and 37 instead of output terminal 35. IQ demodulation circuit 59 carries out demodulation according to the QPSK system when a digital signal modulated according to the QPSK system is received. The remaining circuits of tuner 126 of FIG. 14 besides output terminals 36 and 37 and IQ demodulation circuit 59 are similar to those of tuner 100 of FIG. 1 without down converter 58. Therefore, corresponding components in FIG. 14 have reference characters corresponding to those of FIG. 1 allotted, and their description will not be repeated.

IQ demodulation circuit 59 includes a second intermediate frequency amplify circuit 48 having its gain controlled according to the level of the input signal of AGC terminal 17, mixer circuits 49 and 53, a local oscillation circuit 50, LPFs 51 and 54, post amplifiers 52 and 55 connected to output terminals 36 and 37, and a phase control circuit 56.

IQ demodulation circuit 59 outputs the input signal from branching unit 46 as an I signal (synchronous component signal), and a baseband signal of a Q signal (quadrature phase component signal).

Branching unit 46 provides the IF signal output from intermediate frequency amplify circuit 44 to buffer amplifier 47 and IQ demodulation circuit 59. When the signal applied to input terminal 1 is an analog signal as in FIG. 1, the branch is set to buffer amplifier 47. When the input signal is a digital signal, the branch is set to second intermediate frequency amplify circuit 48 of IQ demodulation circuit 59.

In IQ demodulation circuit 59, the IF signal from branching unit 46 is amplified by intermediate frequency amplify circuit 48 according to the AGC voltage applied to AGC terminal 17. The amplified signal is provided to mixer circuits 49 and 53. In IQ demodulation circuit 59, the oscillated signal from local oscillation circuit 50 is output as two types of signals with the phase shifted by $\pi/2$ (90 degree) from each other by phase control circuit 56. The signals offset by $\pi/2$ from each other are applied to mixer circuits 49 and 53. In mixer circuits 49 and 53, the IF signal from intermediate frequency amplify circuit 48 is mixed with the signal output from phase control circuit 56 to be provided to LPFs 51 and 54. At LPFs 51 and 54, the effect of the oscillated signal leaking from local oscillation circuit 50 is removed and the removal ratio associated with the image signal is improved. Accordingly, conversion into an I signal associated with the received signal and a baseband signal of a Q signal associated with the received signal is effected. The output signals from LPFs 51 and 54 are amplified by post amplifiers 52 and 55. The amplified signals are output as the I signal and the baseband signal of the Q signal to demodulate the received signal according to the QPSK system from output terminals 36 and 37.

Figure 15:
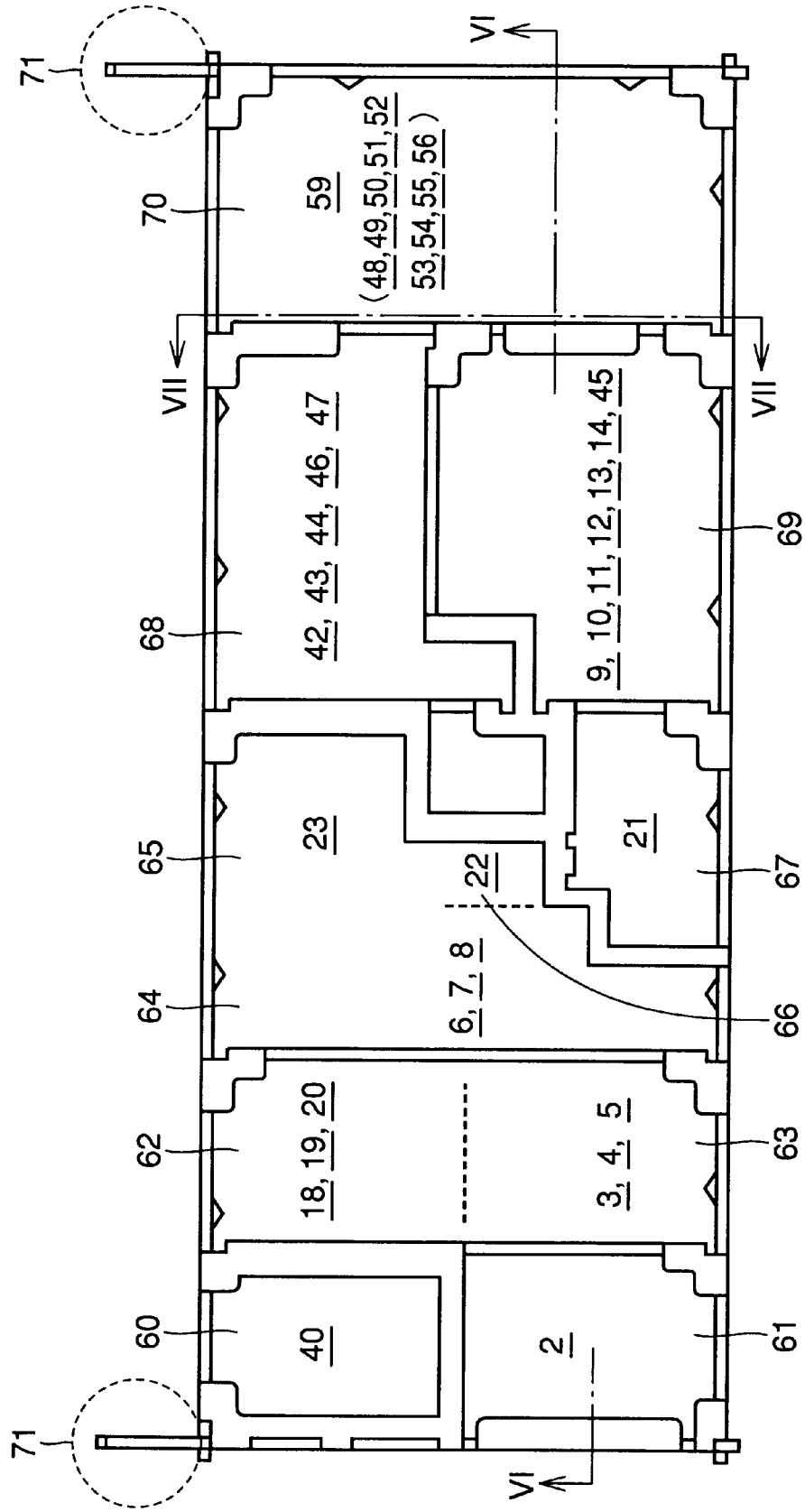
FIG. 15 is a sectional view of a chassis according to the second embodiment.

A casing similar to that described in the first embodiment is used for the casing to accommodate the circuits of tuner 126 of the present embodiment. The arrangement of the circuits in chassis 119 of tuner 126 is shown in FIG. 15. Referring to FIG. 15, a plurality of compartments are provided in an arrangement similar to that of FIG. 4. It is to be noted that the circuit group of IQ demodulation circuit 59 is stored in compartment 70 instead of the circuit group of down converter 58 of FIG. 4. The circuits stored in the other compartments are identical to those of FIG. 4, and description thereof will not be repeated.

As shown in FIG. 4, compartment 69 in which local oscillation circuits 12–14 are stored and compartment 70 in which local oscillation circuit 50 is stored are electromagnetically shielded by a conductive metal plate of FIG. 7 provided in the direction of VII—VII of FIG. 4. Since local spurious is reduced, tuner 126 and IQ demodulation circuit 59 can be stored in the same casing. Any of the shield caps shown in FIGS. 8 and 11 can be used for the shield cap of the casing incorporating tuner 126.

Figure 16:
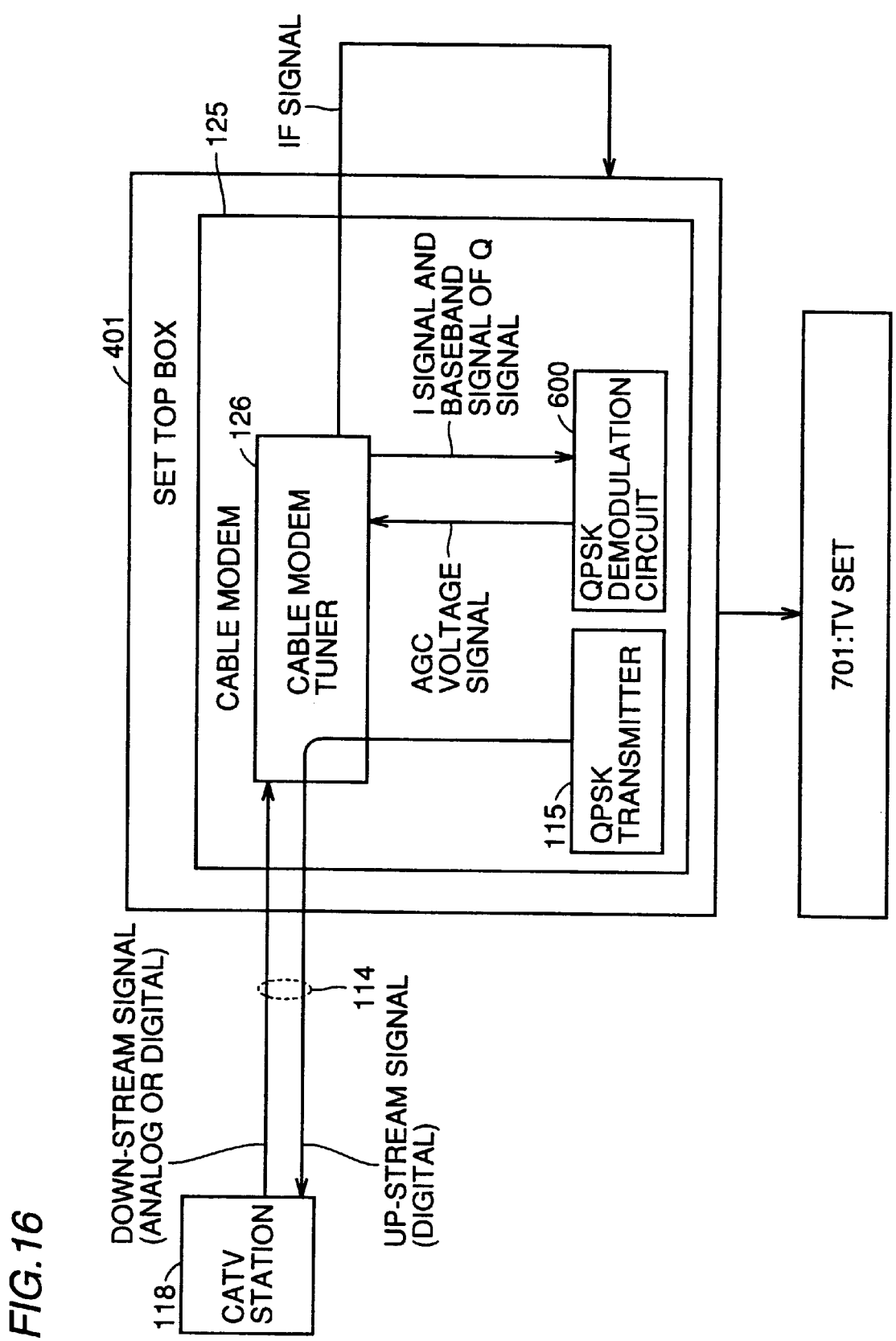
FIG. 16 shows the relationship of connection between the cable modem tuner of the second embodiment and the peripheral apparatus when the tuner is attached to a set up box.
Figure 17:
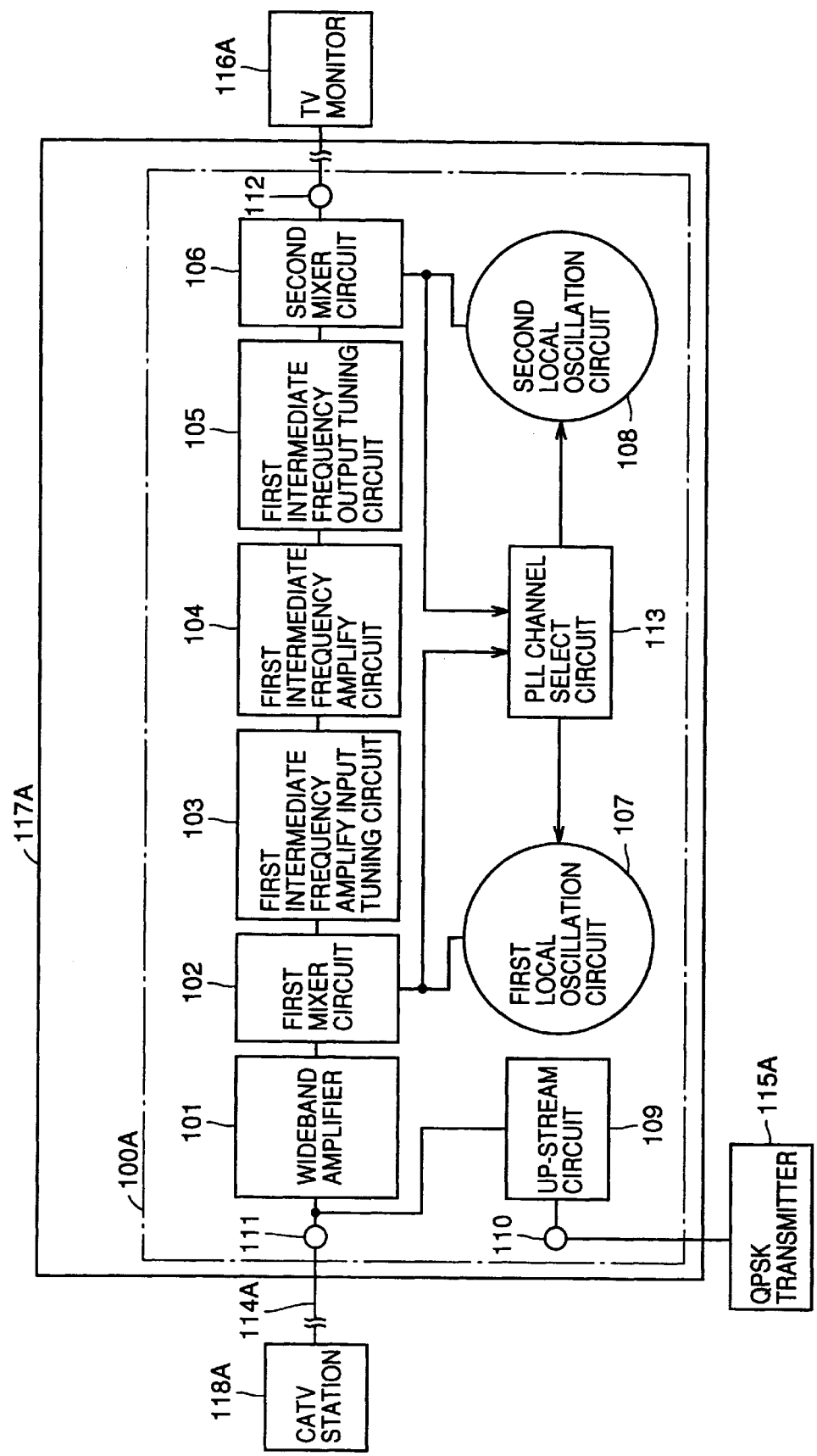
FIG. 17 is a schematic block diagram of a conventional cable modem tuner.

In FIG. 16, a cable modem 125 including cable modem tuner 126, QPSK transmitter 115 and QPSK demodulation circuit 600 is provided within a set top box 401 connected to a TV set 701.

The up-stream digital signal from QPSK transmitter 115 is sent to CATV station 118 via tuner 126, and cable 114.

The down-stream signal from CATV station 118 is received and processed by tuner 126. The processed signal is applied to set top box 401 as an IF signal in the event of an analog signal for video or audio output in TV set 701. In the event of a digital signal, the signal is applied to QPSK demodulation circuit 600 as an I signal and a baseband signal of a Q signal to demodulate the received signal. The signal is subjected to demodulation by QPSK demodulation circuit 600 to be output as a digital signal. Here, the aforementioned AGC voltage signal from QPSK demodulation circuit 600 is applied to tuner 126.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cable modem tuner connected for communication with a CATV station via a cable of a broad band, comprising; in a same casing,
   an up-stream circuit unit for sending an up-stream data signal towards said CATV station on said cable, and
   a receiver unit to receive and process a down-stream signal from said CATV station while removing said up-stream data signal,
   wherein said receiver unit comprises
      a select unit selecting and providing a signal out of signals received via said cable, corresponding to a desired system among a plurality of systems that includes at least two systems according to a frequency band,
      a first tuning unit tuning a signal output from said select unit to a desired high frequency in respective said plurality of systems,
      a high frequency amplify unit amplifying a signal output from said first tuning unit in respective said plurality of systems for output,
      a second tuning unit tuning a signal output from said high frequency amplify unit to said desired high frequency in respective said plurality of systems,
      a frequency converter unit including a first oscillator unit to convert a signal output from said second tuning unit into a signal of a desired intermediate frequency using an oscillation signal of said first oscillator unit in respective said plurality of systems for output,
      an intermediate frequency amplify unit provided in common to said plurality of systems to amplify a signal from said frequency converter unit for output, and
      a signal conversion unit including a second oscillator unit to convert an applied input signal into a signal for demodulation to demodulate said received signal from said intermediate frequency amplify unit using an oscillation signal of said second oscillator unit for output,
   wherein the signal output from said intermediate frequency amplify circuit is output outside when said down-stream signal received is an analog signal, and processed in said signal conversion unit when said received down-stream signal is a digital signal.

2. The cable modem tuner according to claim 1, wherein said signal for demodulation is a baseband signal used to demodulate a received signal according to a QAM (Quadrature Amplitude Modulation) system, and said signal conversion unit includes a down converter to convert an applied input signal into said baseband signal for output by reducing the frequency, when a digital signal modulated according to the QAM system is received as said down-stream signal.

3. The cable modem tuner according to claim 2, said receiver unit further comprising an output unit receiving a signal output from said intermediate frequency amplify unit to output the signal said outside and said signal conversion unit.

4. The cable modem tuner according to claim 3, wherein said output unit includes a branching unit receiving a signal output from said intermediate frequency amplify unit and branching the signal into two directions, said branching unit being connected to said signal conversion unit in one of said two directions, and to a terminal unit in the other direction to output the signal said outside.

5. The cable modem tuner according to claim 1, wherein said casing is formed of a conductive material, wherein said casing has an interior divided into a plurality of compartments by a wall of said conductive material to arranged each portion of said cable modem tuner, said frequency conversion unit and said signal conversion unit being arranged in different compartments.

6. The cable modem tuner according to claim 1, wherein said casing includes a chassis forming a side surface, and two caps forming upper and lower surfaces to shield said casing,
   wherein a convex portion formed protruding towards the interior of said casing is provided at a portion of one of said two caps corresponding to said compartment in which said signal conversion unit is arranged.

7. The cable modem tuner according to claim 1, wherein said signal for demodulation includes an I (synchronous component) signal and a baseband signal of a Q (quadrature phase component) signal used to demodulate a received signal according to a QPSK system (Quadrature Phase Shift Keying) system, and said signal conversion unit is an IQ demodulation circuit converting an applied input signal into said I signal and said baseband signal of the Q signal for output, when a digital signal modulated according to said QPSK system is received as said down-stream signal.

8. The cable modem tuner according to claim 1, wherein said cable modem tuner is provided at a set top box for connecting a television set and said cable.

9. A cable modem tuner connected for communication with a CATV station via a cable of a broad band, comprising; in a same casing,
   an up-stream circuit unit for sending an up-stream data signal towards said CATV station on said cable, and
   a receiver unit to receive and process a down-stream signal from said CATV station while removing said up-stream data signal,
   wherein said receiver unit comprises
      a select unit receiving a signal via said cable to select a signal of a desired frequency band among a plurality of frequency bands including at least two frequency bands,
      a frequency conversion unit including a first oscillator unit corresponding to respective said plurality of frequency bands to convert said desired frequency band signal output from said select unit into an intermediate frequency signal of a desired channel using an oscillation signal of a corresponding one of plurality of said first oscillator units for output, and
      a signal conversion unit including a second oscillator unit to receive an applied signal and converting said applied signal into a signal for demodulation used to demodulate said received signal using an oscillation signal of said second oscillator unit,
      an output signal of said frequency conversion unit being output outside when said received signal is an analog signal, and being output via said signal conversion unit when said received signal is a digital signal.

* * * * *